(12) United States Patent
Witcraft et al.

(10) Patent No.: US 10,850,690 B2
(45) Date of Patent: Dec. 1, 2020

(54) ELECTRONIC DEVICES FOR USE IN A VEHICLE AND METHODS OF OPERATING THE SAME

(71) Applicant: S. C. JOHNSON & SON, INC., Racine, WI (US)

(72) Inventors: Craig J. Witcraft, Vernon Hills, IL (US); Kamran Faterioun, New Berlin, WI (US)

(73) Assignee: S. C. Johnson & Son, Inc., Racine, WI (US)

( * ) Notice: Subject to any disclaimer, the term of this patent is extended or adjusted under 35 U.S.C. 154(b) by 281 days.

(21) Appl. No.: 16/036,461

(22) Filed: Jul. 16, 2018

(65) Prior Publication Data
US 2019/0217795 A1  Jul. 18, 2019

Related U.S. Application Data

(63) Continuation-in-part of application No. 15/873,681, filed on Jan. 17, 2018.

(51) Int. Cl.
*B60R 16/033* (2006.01)
*G01R 31/36* (2020.01)
*B60R 16/03* (2006.01)

(52) U.S. Cl.
CPC ............ *B60R 16/033* (2013.01); *B60R 16/03* (2013.01); *G01R 31/3648* (2013.01)

(58) Field of Classification Search
None
See application file for complete search history.

(56) References Cited

U.S. PATENT DOCUMENTS

| | | |
|---|---|---|
| 2,786,406 A | 3/1957 | White |
| 2,898,649 A | 8/1959 | Murray |
| 4,574,181 A | 3/1986 | Spector |
| 4,808,347 A | 2/1989 | Dawn |

(Continued)

FOREIGN PATENT DOCUMENTS

| | | |
|---|---|---|
| DE | 3841769 C1 | 6/1990 |
| DE | 20302097 U1 | 7/2003 |

(Continued)

OTHER PUBLICATIONS

International Search Report and Written Opinion issued in corresponding International Application No. PCT/US2019/013046, dated Jul. 19, 2019, 18 pages.

(Continued)

*Primary Examiner* — Gregory J Toatley, Jr.
*Assistant Examiner* — Terence E Stifter, Jr.
(74) *Attorney, Agent, or Firm* — Quarles & Brady LLP

(57) ABSTRACT

An electronic device for use in a vehicle and method for controlling the same are provided. The device includes a battery sensor configured to detect a battery voltage when connected to a vehicle's battery, and a processor in communication with the battery sensor. The processor is configured to monitor the battery voltage of a vehicle's battery using the battery sensor and identify at least one transition in the battery voltage. The processor is also configured to determine an operational state of the vehicle based on the transition and the battery voltage, and control the electronic device in accordance with the operational state of the vehicle.

18 Claims, 9 Drawing Sheets

(56) References Cited

U.S. PATENT DOCUMENTS

| | | |
|---|---|---|
| D304,299 S | 10/1989 | Sakamoto |
| 4,921,137 A | 5/1990 | Heijenga |
| 4,968,456 A | 11/1990 | Muderlak et al. |
| D315,202 S | 3/1991 | Kunze |
| 5,007,863 A | 4/1991 | Xuan |
| D336,034 S | 6/1993 | Rebilas |
| 5,373,581 A | 12/1994 | Smith |
| 5,394,506 A | 2/1995 | Stein et al. |
| 5,484,086 A | 1/1996 | Pu |
| 5,529,224 A | 6/1996 | Chan et al. |
| 5,605,308 A | 2/1997 | Quan et al. |
| 5,788,931 A | 8/1998 | Munoz Quintana |
| 5,833,929 A | 11/1998 | Watson et al. |
| D407,640 S | 4/1999 | Nelson et al. |
| 6,021,254 A | 2/2000 | Hunter |
| 6,085,027 A | 7/2000 | Sexton |
| 6,090,349 A | 7/2000 | Hirano |
| 6,099,137 A | 8/2000 | McCormack et al. |
| 6,197,263 B1 | 3/2001 | Blount |
| D442,078 S | 5/2001 | Fuquen |
| D445,674 S | 7/2001 | Pritchett |
| D447,054 S | 8/2001 | Hill |
| 6,278,840 B1 | 8/2001 | Basaganas Millan |
| 6,285,830 B1 | 9/2001 | Basaganas Millan |
| D448,661 S | 10/2001 | Kerr et al. |
| 6,354,710 B1 | 3/2002 | Nacouzi |
| 6,374,044 B1 | 4/2002 | Freidel |
| 6,443,434 B1 | 9/2002 | Prather |
| 6,446,583 B2 | 9/2002 | Vieira |
| 6,466,739 B2 | 10/2002 | Ambrosi et al. |
| D469,348 S | 1/2003 | Demus et al. |
| 6,580,875 B2 | 6/2003 | Rymer |
| 6,592,828 B2 | 7/2003 | Quintana Munoz |
| D481,949 S | 11/2003 | Pinnavaia |
| 6,643,897 B2 | 11/2003 | Chang |
| 6,661,967 B2 | 12/2003 | Levine et al. |
| D484,972 S | 1/2004 | Steele, IV et al. |
| D486,213 S | 2/2004 | Novak |
| 6,782,194 B2 | 8/2004 | Schneiderbauer |
| 6,796,340 B1 | 9/2004 | Ferris et al. |
| 6,854,717 B2 | 2/2005 | Millan |
| 6,859,615 B2 | 2/2005 | Yip et al. |
| D503,343 S | 3/2005 | Canino |
| 6,862,403 B2 | 3/2005 | Pedrotti et al. |
| 6,917,754 B2 | 7/2005 | Pedrotti et al. |
| 6,931,202 B2 | 8/2005 | Pedrotti et al. |
| 6,950,607 B2 | 9/2005 | Yip et al. |
| D513,433 S | 1/2006 | Lemaire |
| 6,996,335 B2 | 2/2006 | Zobele |
| D520,130 S | 5/2006 | Miro |
| D525,352 S | 7/2006 | Lemaire |
| 7,082,259 B2 | 7/2006 | Zobele |
| D527,264 S | 8/2006 | Haley et al. |
| 7,109,850 B2 | 9/2006 | Kawazoe et al. |
| 7,141,215 B2 | 11/2006 | Guan et al. |
| 7,190,888 B2 | 3/2007 | Wolf et al. |
| 7,209,650 B2 | 4/2007 | Caserta et al. |
| D553,499 S | 10/2007 | Lavelli |
| D556,603 S | 12/2007 | Barnes et al. |
| D557,396 S | 12/2007 | Cheng |
| D564,650 S | 3/2008 | Hasik et al. |
| 7,341,698 B2 | 3/2008 | Pedrotti et al. |
| 7,350,720 B2 | 4/2008 | Jaworski et al. |
| 7,389,943 B2 | 6/2008 | Jaworski |
| D573,037 S | 7/2008 | Murray |
| 7,462,329 B2 | 12/2008 | Wefler |
| 7,469,844 B2 | 12/2008 | Conway et al. |
| 7,497,685 B2 | 3/2009 | Kubicek et al. |
| 7,503,668 B2 | 3/2009 | Porchia et al. |
| 7,534,406 B2 | 5/2009 | Takemura |
| 7,544,331 B1 | 6/2009 | Pettaway |
| D598,299 S | 8/2009 | Isogai et al. |
| 7,610,118 B2 | 10/2009 | Schramm et al. |
| D606,882 S | 12/2009 | Sharp et al. |
| D610,910 S | 3/2010 | Simmons et al. |
| 7,687,744 B2 | 3/2010 | Walter et al. |
| D620,809 S | 8/2010 | Caldwell et al. |
| D623,073 S | 9/2010 | Caldwell et al. |
| 7,824,627 B2 | 11/2010 | Michaels et al. |
| D632,566 S | 2/2011 | Caldwell et al. |
| D632,569 S | 2/2011 | Caldwell et al. |
| D634,643 S | 3/2011 | Caldwell et al. |
| 7,931,213 B2 | 4/2011 | Ousley |
| 7,932,482 B2 | 4/2011 | Norwood et al. |
| 7,938,338 B2 | 5/2011 | Janakat et al. |
| 7,954,667 B2 | 6/2011 | Furner et al. |
| 7,962,017 B2 | 6/2011 | Viera |
| D643,737 S | 8/2011 | Handy |
| 8,005,349 B2 | 8/2011 | Deflorian et al. |
| D646,572 S | 10/2011 | Koeleman |
| D646,926 S | 10/2011 | Willat et al. |
| 8,061,562 B2 | 11/2011 | Carpenter et al. |
| D652,319 S | 1/2012 | Cohen et al. |
| 8,091,734 B2 | 1/2012 | Furner et al. |
| 8,196,902 B1 | 6/2012 | Pystin |
| 8,197,761 B1 | 6/2012 | Miller-Larry |
| D663,618 S | 7/2012 | Cohen et al. |
| D671,004 S | 11/2012 | Kelly et al. |
| D671,409 S | 11/2012 | Cohen et al. |
| 8,342,363 B2 | 1/2013 | Carpenter et al. |
| 8,371,310 B2 | 2/2013 | Brenneise |
| 8,386,199 B2 * | 2/2013 | Goff ................. G01R 31/3647 702/63 |
| D680,208 S | 4/2013 | Gordon |
| D680,882 S | 4/2013 | Logue |
| 8,412,029 B2 | 4/2013 | Browder et al. |
| 8,437,908 B2 | 5/2013 | Goff et al. |
| D685,076 S | 6/2013 | Gordon |
| 8,463,114 B2 | 6/2013 | Garcia Fabrega et al. |
| D686,922 S | 7/2013 | Davis et al. |
| 8,498,524 B2 | 7/2013 | Ruiz Ballesteros et al. |
| 8,662,480 B1 | 3/2014 | Irvin |
| 8,678,233 B2 | 3/2014 | Furner et al. |
| 8,718,454 B2 | 5/2014 | Caserta et al. |
| D706,644 S | 6/2014 | Ruiz, Sr. et al. |
| 8,750,694 B1 | 6/2014 | Porretta et al. |
| 8,787,739 B2 | 7/2014 | Hsiao |
| 8,887,954 B2 | 11/2014 | Carpenter et al. |
| 8,983,277 B2 | 3/2015 | Hsiao |
| 8,983,278 B2 | 3/2015 | Ruiz Ballesteros et al. |
| 8,983,279 B2 | 3/2015 | Adair et al. |
| 9,031,392 B2 | 5/2015 | Hsiao |
| 9,042,712 B2 | 5/2015 | Irvin et al. |
| D752,391 S | 3/2016 | Hatherell |
| D758,206 S | 6/2016 | Hoeke et al. |
| 9,388,994 B2 | 7/2016 | Hidaka et al. |
| 9,393,337 B2 | 7/2016 | Gruenbacher et al. |
| 9,399,080 B2 | 7/2016 | Irvin et al. |
| 9,408,936 B2 | 8/2016 | Esses |
| D772,070 S | 11/2016 | Broen et al. |
| 9,522,208 B2 | 12/2016 | Esses |
| D781,150 S | 3/2017 | Zoppas |
| D786,684 S | 5/2017 | McGreevy et al. |
| 2002/0176704 A1 | 11/2002 | Roe |
| 2003/0184935 A1 | 10/2003 | Enzinna et al. |
| 2004/0229110 A1 | 11/2004 | Tsai |
| 2006/0188238 A1 | 8/2006 | Kent |
| 2006/0193610 A1 | 8/2006 | Han |
| 2006/0292110 A1 | 12/2006 | Reinhardt |
| 2007/0235555 A1 | 10/2007 | Helf et al. |
| 2009/0041442 A1 | 2/2009 | Rouse, Jr. |
| 2009/0078253 A1 | 3/2009 | Bao |
| 2009/0232710 A1 | 9/2009 | Kinsey |
| 2009/0302019 A1 | 12/2009 | Selenski et al. |
| 2010/0209081 A1 | 8/2010 | Rymer |
| 2010/0326280 A1 | 12/2010 | Hicks |
| 2011/0106373 A1 | 5/2011 | Hergesheimer et al. |
| 2011/0132995 A1 | 6/2011 | Perman |
| 2012/0018529 A1 | 1/2012 | Gammon et al. |
| 2012/0201523 A1 | 8/2012 | Tebe Poves et al. |
| 2012/0224995 A1 | 9/2012 | McMinn |
| 2014/0091487 A1 | 4/2014 | Belongia |
| 2014/0126892 A1 | 5/2014 | Hsiao |
| 2014/0193764 A1 | 7/2014 | Pizzini |

(56) References Cited

U.S. PATENT DOCUMENTS

| | | | |
|---|---|---|---|
| 2016/0015847 A1 | 1/2016 | Irvin et al. | |
| 2016/0022855 A1 | 1/2016 | Esses | |
| 2016/0022857 A1 | 1/2016 | Esses | |
| 2016/0107186 A1 | 4/2016 | Chao et al. | |
| 2016/0152117 A1 | 6/2016 | Backman et al. | |
| 2016/0161367 A1* | 6/2016 | Chu | G01M 15/02 324/433 |
| 2016/0256585 A1 | 9/2016 | Esses | |
| 2016/0279278 A1 | 9/2016 | Gruenbacher et al. | |
| 2016/0325605 A1 | 11/2016 | Irvin et al. | |
| 2017/0112191 A1 | 4/2017 | Sur et al. | |
| 2017/0112194 A1 | 4/2017 | Sur et al. | |
| 2017/0112195 A1 | 4/2017 | Sur et al. | |
| 2017/0112196 A1 | 4/2017 | Sur et al. | |
| 2017/0112955 A1 | 4/2017 | Bourne | |
| 2017/0128608 A1 | 5/2017 | Hsiao | |
| 2017/0150757 A1 | 6/2017 | Worm et al. | |
| 2017/0167739 A1 | 6/2017 | Williams | |
| 2017/0209612 A1 | 7/2017 | Westphal et al. | |
| 2017/0232128 A1 | 8/2017 | Esses | |
| 2017/0252476 A1 | 9/2017 | Koontz et al. | |
| 2017/0282722 A1 | 10/2017 | Abou-Zeid | |
| 2017/0310804 A1* | 10/2017 | Rhyne | H04M 1/72569 |

FOREIGN PATENT DOCUMENTS

| | | |
|---|---|---|
| DE | 20302098 U1 | 7/2003 |
| DE | 10305480 A1 | 8/2004 |
| DE | 10305481 A1 | 8/2004 |
| DE | 102005041986 A1 | 3/2007 |
| EM | 000277660-0002 | 1/2005 |
| EM | 000395389-0002 | 8/2005 |
| EM | 000668785-0001 | 2/2007 |
| EM | 000758743-0022 | 7/2007 |
| EM | 000758743-0024 | 7/2007 |
| EM | 001118384-0011 | 4/2009 |
| EM | 001154470-0001 | 7/2009 |
| EM | 001215875-0001 | 5/2010 |
| EM | 001215875-0002 | 5/2010 |
| EM | 001215875-0003 | 5/2010 |
| EM | 001750373-0001 | 9/2010 |
| EM | 001292627-0001 | 9/2011 |
| EM | 002005181-0001 | 3/2012 |
| EM | 002280933-0004 | 7/2013 |
| EM | 002280933-0007 | 7/2013 |
| EM | 002306704-0001 | 9/2013 |
| EM | 002366609-0001 | 12/2013 |
| EM | 002444570-0001 | 4/2014 |
| EM | 002521591-0004 | 8/2014 |
| EM | 002646554-0007 | 3/2015 |
| EM | 002646554-0008 | 3/2015 |
| EM | 002664839-0003 | 3/2015 |
| EM | 002677765-0001 | 4/2015 |
| EM | 002677765-0002 | 4/2015 |
| EM | 002678821-0021 | 4/2015 |
| EM | 002678821-0022 | 4/2015 |
| EM | 002688143-0001 | 4/2015 |
| EM | 002738773-0003 | 7/2015 |
| EM | 002760538-0001 | 8/2015 |
| EM | 003037548-0007 | 3/2016 |
| EM | 003122761-0003 | 5/2016 |
| EM | 003456482-0001 | 11/2016 |
| EM | 003456821-0001 | 11/2016 |
| EM | 003763689-0001 | 2/2017 |
| EM | 003814508-0001 | 3/2017 |
| EM | 003814508-0002 | 3/2017 |
| EM | 003814508-0003 | 3/2017 |
| EM | 003847151-0001 | 4/2017 |
| EM | 003847151-0002 | 4/2017 |
| EM | 003847151-0003 | 4/2017 |
| EM | 003847151-0004 | 4/2017 |
| EM | 003847151-0005 | 4/2017 |
| EM | 003847151-0006 | 4/2017 |
| EM | 003847151-0007 | 4/2017 |
| EM | 003847151-0008 | 4/2017 |
| EM | 003847177-0001 | 4/2017 |
| EM | 003847177-0002 | 4/2017 |
| EM | 003847177-0003 | 4/2017 |
| EM | 003847177-0004 | 4/2017 |
| EM | 003847177-0005 | 4/2017 |
| EM | 003847177-0006 | 4/2017 |
| EM | 003847177-0007 | 4/2017 |
| EM | 003847177-0008 | 4/2017 |
| EM | 003849975-0001 | 4/2017 |
| EM | 003849975-0002 | 4/2017 |
| EM | 003850718-0001 | 4/2017 |
| EM | 003850718-0002 | 4/2017 |
| EM | 003997030-0001 | 5/2017 |
| EM | 004096386-0001 | 7/2017 |
| EP | 325468 B1 | 6/1991 |
| EP | 2985738 A1 | 2/2016 |
| ES | 2328315 B1 | 9/2010 |
| GB | 2227665 B | 4/1992 |
| GB | 2443925 A | 5/2008 |
| WO | 1997039778 A1 | 10/1997 |
| WO | 2003077961 A1 | 9/2003 |
| WO | 2005092399 A1 | 10/2005 |
| WO | 2007018402 A1 | 2/2007 |
| WO | 2007083042 A2 | 7/2007 |
| WO | 2011020491 A1 | 2/2011 |
| WO | DM/080 572 | 4/2013 |
| WO | 2013106982 A1 | 7/2013 |
| WO | 2014022164 A2 | 2/2014 |
| WO | 2014055478 A2 | 4/2014 |
| WO | 2014087173 A1 | 6/2014 |
| WO | DM/089 369 | 2/2016 |
| WO | 2016083165 A1 | 6/2016 |
| WO | 2016096272 A1 | 6/2016 |
| WO | 2016155333 A1 | 10/2016 |
| WO | 2016180663 A1 | 11/2016 |
| WO | DM/094 995 | 1/2017 |
| WO | 2017070039 A1 | 4/2017 |
| WO | 2017131942 A2 | 8/2017 |
| WO | 2017151322 A1 | 9/2017 |

OTHER PUBLICATIONS

International Search Report and Written Opinion issued in corresponding International Application No. PCT/US2019/038483, dated Sep. 6, 2019, 13 pages.

\* cited by examiner

ELECTRONIC DEVICES FOR USE IN A VEHICLE AND METHODS OF OPERATING THE SAME

CROSS REFERENCE TO RELATED APPLICATIONS

This application is a continuation-in-part of U.S. application Ser. No. 15/873,681 filed Jan. 17, 2018.

REFERENCE REGARDING FEDERALLY SPONSORED RESEARCH OR DEVELOPMENT

Not applicable

SEQUENTIAL LISTING

Not applicable

BACKGROUND

1. Field of the Invention

The present disclosure generally relates to automotive applications, and more specifically, to electronic devices for use in a vehicle and methods of operating the same.

2. Description of the Background of the Invention

Many modern electronic devices, including cell phones, tablets, laptops, and others, are often recharged using vehicle power. In addition, individuals often utilize personal volatile emitting devices in their vehicles, such as air fresheners, odor eliminators, or other devices designed to assist in eliminating pests, cleaning, or freshening the surrounding environment. In particular, many volatile emitting devices include a heat source or fan that that assist in the dispersion or release of the volatile from a cartridge. To operate heating elements, fans, and other circuitry, volatile emitting devices and other devices are designed to utilize power from the 12V accessory outlet of the vehicle.

However, many electronic devices may continue to draw power even after the vehicle has been turned off. If left connected for an extended period of time, this can result in unwanted battery drain and perhaps vehicle incapacitation, particularly for devices that draw high power. In the case of personal volatile emitting devices, volatiles may also be depleted prematurely. To avoid such difficulties, some technologies have attempted to include capabilities for determining whether a vehicle is on or off by incorporating vibration sensors, for instance. However, vibration sensors can produce errors due to their inability to discriminate vibrations unrelated to vehicle operation. In addition, vibration sensors increase device cost and design complexity.

Therefore, a need exists for a low cost, reliable way of controlling electronic devices based on the operational state of a vehicle.

SUMMARY

The present disclosure overcomes drawbacks of previous technologies. Features and advantages of the present disclosure will become apparent from the following description.

In one aspect of the present disclosure, a method for controlling an electronic device for use in a vehicle is provided. The method includes the steps of detecting a battery voltage of a vehicle's battery using a battery sensor connected thereto, and determining an operational state of the vehicle using the battery voltage. The method also includes the step of controlling an electronic device coupled to the vehicle's battery in accordance with the operational state of the vehicle.

In another aspect of the present disclosure, an electronic device for use in a vehicle is provided. The device includes a battery sensor configured to detect a battery voltage when connected to a vehicle's battery, and a processor in communication with the battery sensor. The processor is configured to sample the battery voltage detected by the battery sensor, and determine an operational state of the vehicle using the battery voltage. The processor is also configured to control the electronic device in accordance with the operational state of the vehicle.

In yet another aspect of the present disclosure, a volatile emitting device for use in a vehicle is provided. The device includes a cartridge having a volatile material therein and an electrical assembly. The device also includes a housing having a cavity configured to hold the cartridge and electrical assembly. The electrical assembly includes a battery sensor configured to detect a battery voltage when connected to a battery of the vehicle, and a processor in communication with the battery sensor. The processor is configured to sample the battery voltage detected by the battery sensor, and determine an operational state of the vehicle using the battery voltage. The processor is also configured to control a release of the volatile material in accordance with the operational state of the vehicle.

In yet another aspect of the present disclosure, a method for controlling an electronic device for use in a vehicle is provided. The method includes monitoring a battery voltage of a vehicle's battery using a battery sensor connected thereto, and identifying at least one transition in the battery voltage using a processor in communication with the battery sensor. The method also includes determining, using the processor, an operational state of the vehicle based on the transition and the battery voltage, and controlling, using the processor, an electronic device coupled to the vehicle's battery in accordance with the operational state of the vehicle.

In still another aspect of the present disclosure, an electronic device for use in a vehicle is provided. The device includes a battery sensor configured to detect a battery voltage when connected to a vehicle's battery, and a processor in communication with the battery sensor. The processor is configured to monitor the battery voltage of a vehicle's battery using the battery sensor and identify at least one transition in the battery voltage. The processor is also configured to determine an operational state of the vehicle based on the transition and the battery voltage, and control the electronic device in accordance with the operational state of the vehicle.

BRIEF DESCRIPTION OF THE DRAWINGS

Other aspects and advantages of the present invention will become apparent upon consideration of the following detailed description, wherein similar structures have similar reference numerals.

DETAILED DESCRIPTION

The present disclosure is directed to a novel approach for controlling electronic devices for use in a vehicle. In particular, methods for operating devices based on the operational state of the vehicle are provided. As will become apparent from the description below, methods described herein may be advantageously implemented for a wide variety of electronic devices commonly used in vehicles, including volatile emitting devices, cell phones, tablets, laptops, GPS devices, navigation units, cameras, FM broadcasters, Bluetooth devices, AC adapters, video games, air compressors, and many others.

Figure 1:
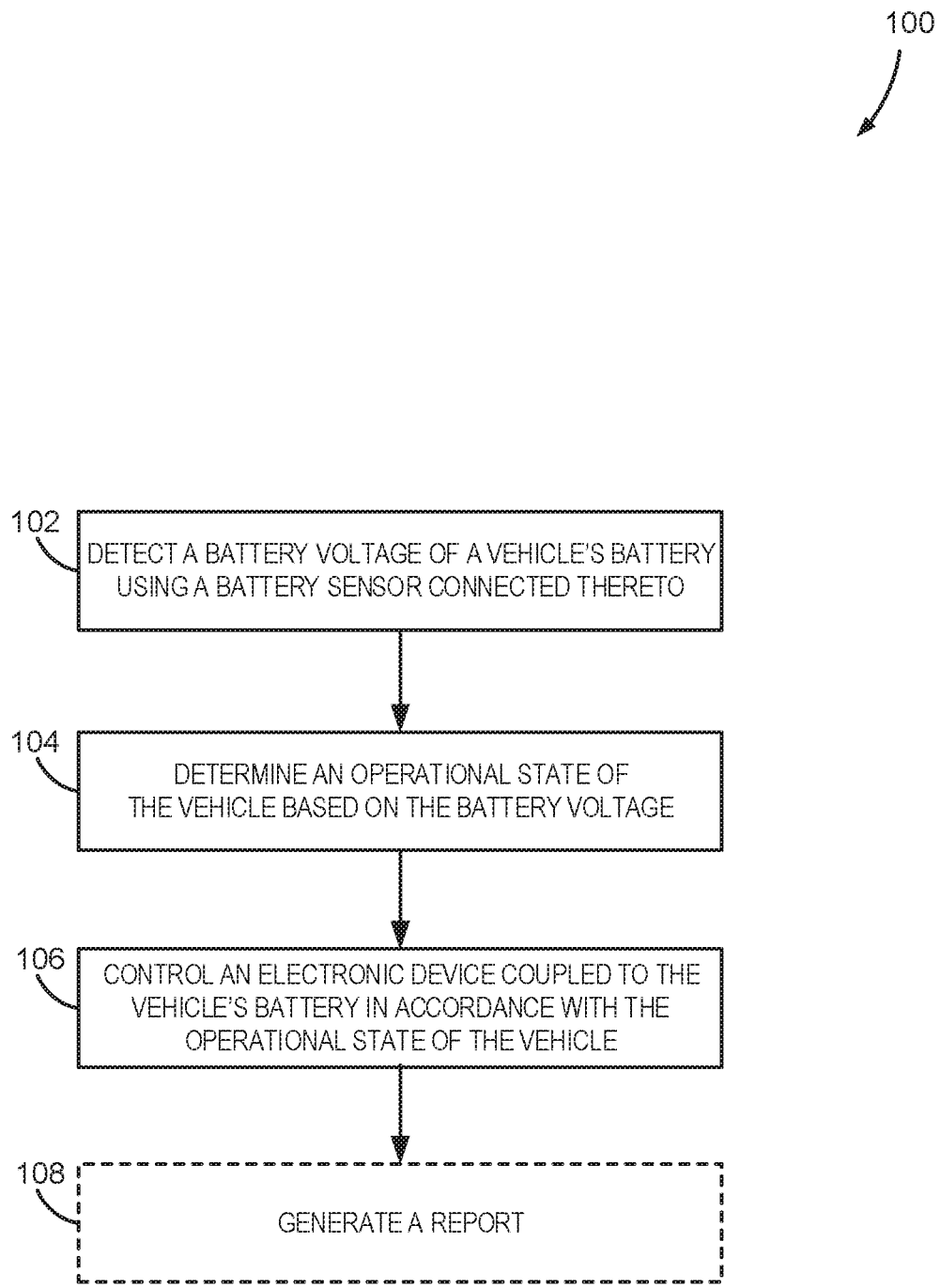
FIG. 1 is a flowchart setting forth steps of a process, in accordance with aspects of the present disclosure.

Referring to FIG. 1, steps of a process 100 are shown, which may be carried out using any suitable device, apparatus, or system, including devices described in the present disclosure. Steps of the process 100 may be implemented as a program, firmware, or executable instructions stored in non-transitory computer readable media.

The process 100 may begin at process block 102 by detecting a battery voltage of a vehicle's battery. The battery voltage may be detected using a battery sensor connected or connectable to the vehicle's battery. The battery sensor may be electrically connected, but need not be physically connected, to the vehicle's battery. As will be described, in some embodiments, the battery sensor may be incorporated into, or may be part of, various electronic devices, such as portable electronic devices, volatile emitting devices, and others. In other embodiments, the battery sensor may be part of the vehicle circuitry.

In some aspects, the battery voltage detected by the battery sensor may be sampled over a predefined period of time, either intermittently or periodically using a predefined sampling frequency. By way of example, the predefined period of time may range approximately between a few seconds and 30 minutes. However, in some implementations, the period of time may be less than a second or longer than 30 minutes. Also, the predefined sampling frequency may range between approximately 0.1 Hz, or less, and 10,000 Hz, or more.

As used herein, the term approximately, when referring to a numerical value, allows for a positive or a negative variation of the numerical value by up to and including 10% of the numerical value. The battery voltage may then be analyzed by a processor to generate various information therefrom. Such information may include, for instance, maximum battery voltage, minimum battery voltage, average battery voltage, battery voltage standard deviation, rate of change of the battery voltage, and so forth.

Then, at process block 104, an operational state of the vehicle may be determined based on the battery voltage detected. In some aspects, the battery voltage may be compared to one or more predefined thresholds. In addition, information obtained from the analyzed battery voltage samples may be compared to predefined signatures. Such thresholds and signatures may be obtained by measuring battery voltage in various vehicle operation scenarios.

In general, the battery voltage level depends on whether the vehicle's engine is on or off. As such, battery voltage may be used as an indicator of the operational state of the vehicle's engine. Specifically, when the engine is off, battery voltage can range up to (or approximately to) a nominal voltage of 12.6V, depending upon the battery's age and charge level. When the engine is on, the vehicle alternator charges the battery, and the battery voltage rises to the operating voltage of the vehicle alternator, which is typically greater than 13.0V. Therefore, a battery voltage above a threshold of approximately 13.0V may indicate an "ON" state of the vehicle's engine.

However, some "smart" alternators can also drive a vehicle battery at an operating voltage below 13.0V. For instance, the battery voltage may be close to a voltage corresponding to the engine being off. Therefore, a measurement below 13.0V might not conclusively indicate whether the vehicle is in an "ON" or "OFF" state. To differentiate between the two operational states, a load may be applied to the battery for a period of time while the battery voltage is monitored. Specifically, a change in the battery voltage may then be used to determine the state. For instance, if the battery voltage rises, does not change at all, does not appreciably change, or drops slower than a predetermined rate, then the battery is charging, and the vehicle is in an "ON" state. Otherwise, if the battery voltage drops faster than the predetermined rate, the battery is not charging and the vehicle's engine is in an "OFF" state.

The period of time for monitoring the battery voltage may vary from a few seconds, or less, to 30 minutes, or more. In some aspects, the period of time may depend on the load being applied, the sampling rate of the battery voltage, as well as the time required to observe any appreciable changes in the battery voltage, if they should occur. In other aspects, the period of time may also depend on the type of vehicle. For instance, a hybrid vehicle may automatically turn off its engine at stop lights, railroad crossings, and so on, to conserve resources. Therefore, a period of time sufficient to distinguish operational states in such scenarios would be advantageous. This would allow operation of an electronic device to continue without interruption.

Although the description above makes reference to the state of the vehicle's engine, the operational state of the vehicle determined at process block 104 may also refer to a state of the ignition, for instance, in accordance with a position of an ignition key.

Referring again to FIG. 1, an electronic device coupled to the vehicle's battery may then be controlled at process block 106 in accordance with the operational state of the vehicle. The process of controlling the device may include adapting one or more functions or operational aspects of the device. In some implementations, those functions or operational aspects of the device requiring substantial power from the vehicle's battery may be turned off or converted to a low-power mode if the vehicle is in an "OFF" state or the vehicle's battery is discharged below a predetermined threshold. In one example, charging of the electronic device using the vehicle's battery may be modified or interrupted if the vehicle is determined to be in an "OFF" state. In another example, an electronic device, or various components therein, relying on power from the vehicle's battery may be turned off or entered into a low-power mode. Specifically, power to a heating element, fan or USB port of a volatile emitting device may be interrupted or reduced. It may be appreciated that these examples are not limiting, and a wide variety of a device's functions or operational aspects may be controlled based on what the operational state of the vehicle is determined to be.

In some aspects, a report may be generated, as indicated by process block 108. The report may be in any form and include any information. The report may be provided to an output, and/or stored in a memory. For example, the report may be provided using a display and/or LEDs, and so forth, and indicate various battery voltages detected, a determined operational state of the vehicle, a condition of a device, a communication link, and other data or information.

Figure 2:
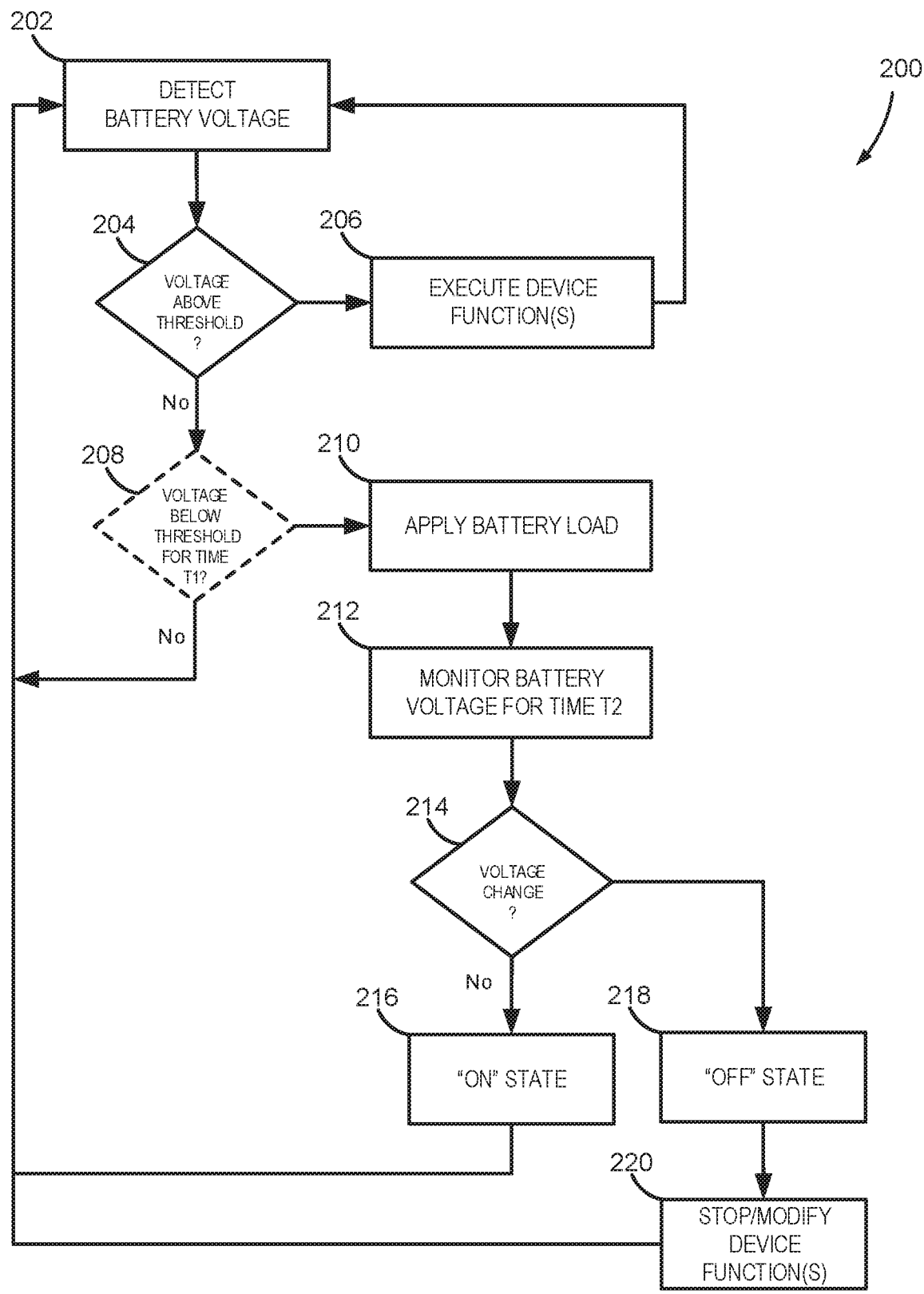
FIG. 2 is another flowchart setting forth steps of a process, in accordance with aspects of the present disclosure.

Turning now to FIG. 2, another flowchart setting forth steps of a process 200, in accordance with aspects of the present disclosure, is shown. The process 200 may be carried out using any suitable device, apparatus, or system, including devices described in the present disclosure. Steps of the process 200 may be implemented as a program, firmware, or executable instructions stored in non-transitory computer readable media.

The process 200 may begin at process block 202 by detecting the battery voltage of a vehicle. As described, battery voltage may be detected using a battery sensor coupled to the vehicle's battery and sampled intermittently or periodically over a predetermined period of time. Then, a determination is made whether the battery voltage is above a threshold, as indicated by decision block 204. As an example, the threshold may be approximately 13.0V, although other thresholds may be possible.

The determination at decision block 204 can be made based on one or more battery voltage samples obtained at process block 202, as described. In one example, the determination may be made based on whether an average battery voltage is above the threshold. If the battery voltage, or average battery voltage, is above the threshold, one or more functions or operational aspects of an electronic device coupled to the battery may be executed, as indicated by process block 206. Example functions may include charging the device, operating a heating element, operating a fan, and so on.

If the battery voltage, or average battery voltage, is below the threshold, another determination may be optionally made, as indicated by decision block 208. Specifically, it may be determined whether the battery voltage, or average battery voltage, is below the threshold for a time T1. In one example, T1 may be approximately 30 minutes, although T1 could be longer or shorter, and may depend on the sampling rate of the battery voltage, vehicle type, and other factors, as mentioned. This could help avoid, for instance, incorrect determinations based on voltage spikes or other transients. If the battery voltage, or average battery voltage, persists below the threshold for the time T1, a load may then applied to the battery, as indicated by process block 210. Otherwise, process block 202 may be repeated, as desired.

The battery voltage may then be monitored for a time T2 at process block 212. For example, the battery voltage may be monitored for approximately one minute, or less, or more. Then, a determination is made at decision block 214 with respect to any changes in the battery voltage. Specifically, if the battery voltage, or average battery voltage, rises, does not appreciably change, does not change at all, or drops slower than a predetermined rate as a result of the applied load, then the battery is charging. Thus, the vehicle is in an "ON" state, as indicated by process block 216. Otherwise, if the battery voltage drops faster than the predetermined rate, then the battery is not charging, and the vehicle is in an "OFF" state, as indicated by process block 218.

In some preferred implementations, the applied load and/or duration T2 for monitoring the battery voltage at process blocks 210 and 212 may be configured such that a determination at decision block 214 can be made without adversely affecting the battery. For instance, the applied load and/or duration T2 may be selected to induce a detectable change in the battery voltage when the vehicle is in an "OFF" state, and without significantly discharging the battery.

As indicated by process block 220, one or more device functions or operational aspects may be stopped or modified if the vehicle is determined to be in an "OFF" state. In one non-limiting example, operation of a heating element or fan may be stopped or reduced. In another non-limiting example, the device may be placed into a low-power state or device charging may be interrupted.

Figure 3:
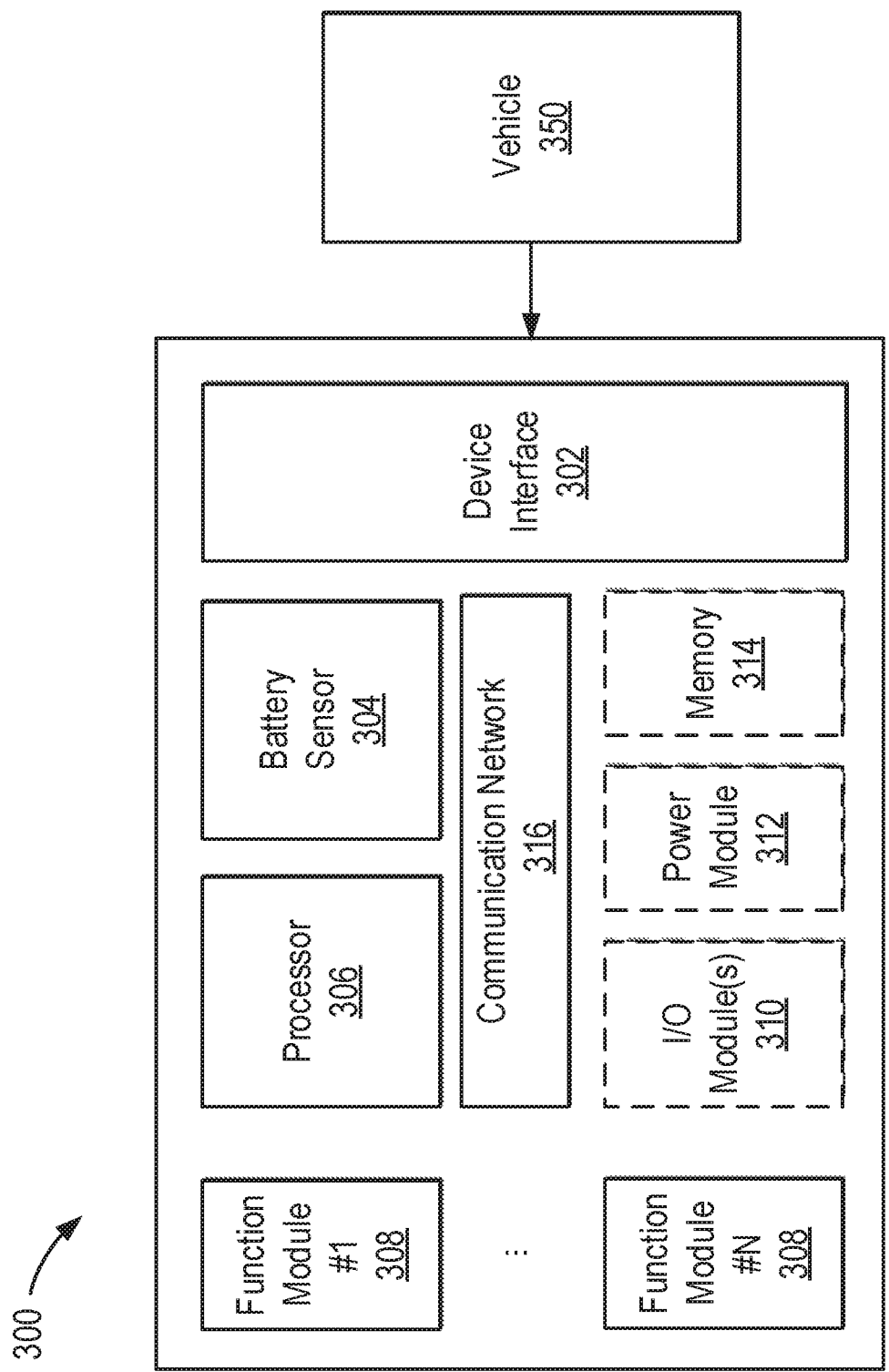
FIG. 3 is a schematic diagram of an electronic device, in accordance with aspects of the present disclosure.

Turning now to FIG. 3, a schematic diagram of an electronic device 300, in accordance with aspects of the present disclosure, is shown. As illustrated, the device 300 is configured to cooperate with a vehicle 350. In general, the vehicle 350 may include an automobile, an aircraft, a boat, a drone, a golf cart, and others.

As shown, the device 300 may generally include a device interface 302, a battery sensor 304, a processor 306, and a number of function modules as 308. The device 300 may optionally include one or more input/output (I/O) modules 310, a power module 312, a memory 314, as well as other elements or circuitry. A communication network 316 may also be included in the device 300 and configured to facilitate the exchange of data, signals, and other information between the various elements of the device 300.

The device interface 302 may be configured to exchange data, signals, and other information with a variety of devices and/or a system. As shown in FIG. 3, in some embodiments, the device interface 302 allows communication of signals, data, and other information with the vehicle 350. In particular, the device interface 302 may be configured to provide an electrical wired or wireless connection between the battery of the vehicle 350 and various components in the device 300, such as the battery sensor 304, the power module 312, and others. In one example, the device interface 302 may include one or more electrical connectors configured to make an electrical contact with the vehicle 350. In some embodiments, the electrical connectors are configured to couple to a power socket of the vehicle 350, thereby electrically coupling or connecting the device 300, and various components therein, to the vehicle's battery.

The battery sensor 304 is in communication with the device interface 302 and configured to detect the battery voltage of the vehicle 350. In some implementations, the battery sensor 304 may include a voltage detector configured to at least detect voltages in a range applicable to vehicle battery voltages. Example voltage detectors may include voltmeters, data acquisition cards, Arduino boards, and other analog and/or digital circuitry. In addition, in some implementations, the battery sensor 304 may include a variety of other electronic components and hardware for acquiring, pre-processing, and/or modifying signals (e.g. voltages or currents) received via the device interface 302. In some implementations, such electronic components and hardware may be configured to sample, amplify, filter, scale, and digitize signals received by the battery sensor 304. The battery sensor 304 may also include various protective circuitry, fault detectors, switches, and so on, configured for protecting sensitive components in the device 300.

In addition to being configured to carry out various processes of the device 300, the processor 306 may be configured to execute steps, in accordance with methods of the present disclosure. Specifically, the processor 306 may include one or more processors or processing units configured to carry out steps to determine a state of operation of the vehicle 350 based on the battery voltage detected. The processor 306 may also control operation of the device 300 in accordance with the operational state, as described. In some aspects, the processor 306 may also determine and generate a report indicating a state of a vehicle's battery (e.g., discharged state, charging state, full state, and so on), as well as other information related to battery voltage detected and a vehicle's operational state(s). To do so, the processor 306 may execute hardwired instructions or programming. As such, the processor 306, or various processing units therein, may therefore be application-specific due to the hardwired instructions or programming therein. Alternatively, the processor 306 may execute non-transitory instructions stored in the memory 314, as well as instructions received via input. By way of example, the processor 306 may include one or more general-purpose programmable processors, such as central processing units ("CPUs"), graphical processing units ("GPUs"), microcontrollers, and the like.

In some aspects, the processor 306 may control one or more function modules 308 in the device 300. As shown in FIG. 3, the device 300 may include one or more function modules 308 that are configured to carry out specific functions in the device 300. In one non-limiting example, one function module 308 may be configured to control a heating element, or a fan in the device 300. In another non-limiting example, another function module 308 may be configured to control the charging of a battery in the device 300. In yet another non-limiting example, another function module 308 may be configured to control charging of an external battery connected to the device 300, where the external battery (e.g., of a cell phone or tablet) is connected via a USB port on the device 300. In yet another non-limiting example, yet another function module 308 may be configured to control the power module 312 to modify a power state of the device 300 (e.g., normal power state, low-power state, sleep state, and so forth). Alternatively, the power module 312 may be controlled directly by the processor 306. In yet another non-limiting example, another function module 308 may communicate with the I/O module(s) 310 to provide a report indicating a condition of the device 300. To this end, the one or more function modules 308 may include a variety of elements, circuitry, and hardware, including various signal sources, signal processors, integrated circuits, digital-to-analog ("DAC") converters, analog-to-digital converters ("ADC"), pulse width modulation ("PWM") generators, analog/digital voltage switches, analog/digital pots, relays, and other electrical components.

As mentioned, the device 300 may optionally include I/O module(s) 310 configured to receive a variety of data, information, as well as selections, and operational instructions from an operator. To this end, the I/O module(s) 310 may also include various drives, ports, receptacles, and elements for providing input, including a touchpad, touch screen, buttons, switches, toggles, flash-drives, USB ports/drives, CD/DVD drives, communication ports, modules, and connectors, and so on. The I/O module(s) 310 may also be configured to provide a report by way of various output elements, including screens, LEDs, LCDs, alarm sources, and so on.

The power module 312 may be configured to provide power to various elements of the device 300. In some implementations, the power module 312 may power the various elements by way of a vehicle battery. Additionally, or alternatively, the power module 312 may include an internal source of power, including a rechargeable or replaceable battery. To this end, the power module 312 may control the charging of the battery, as well as dissemination of power provided by the vehicle 350 and/or battery. In some implementations, the power module 312 may also provide power to an external device, or control the charging of the external device, connected to the device 300 using a USB port, for example.

The memory 314 may store a variety of information and data, including, for example, operational instructions, data, and so on. In some aspects, the memory 314 may include non-transitory computer readable media having instructions executable by the processor 306. The memory 314 may also store data corresponding to detected battery voltages and information generated therefrom, including battery states, vehicle operational states, and so on.

The communication network 316 may include a variety of communication capabilities and circuitry, including various wiring, components, and hardware for electronic, radiofrequency ("RF"), optical, and other communication methods. By way of example, the communication network 316 may include parallel buses, serial buses, and combinations thereof. Example serial buses may include serial peripheral interface (SPI), I2C, DC-BUS, UNI/O, 1-Wire, and others. Example parallel buses may include ISA, ATA, SCSI, PIC, IEEE, and others.

Figure 4:
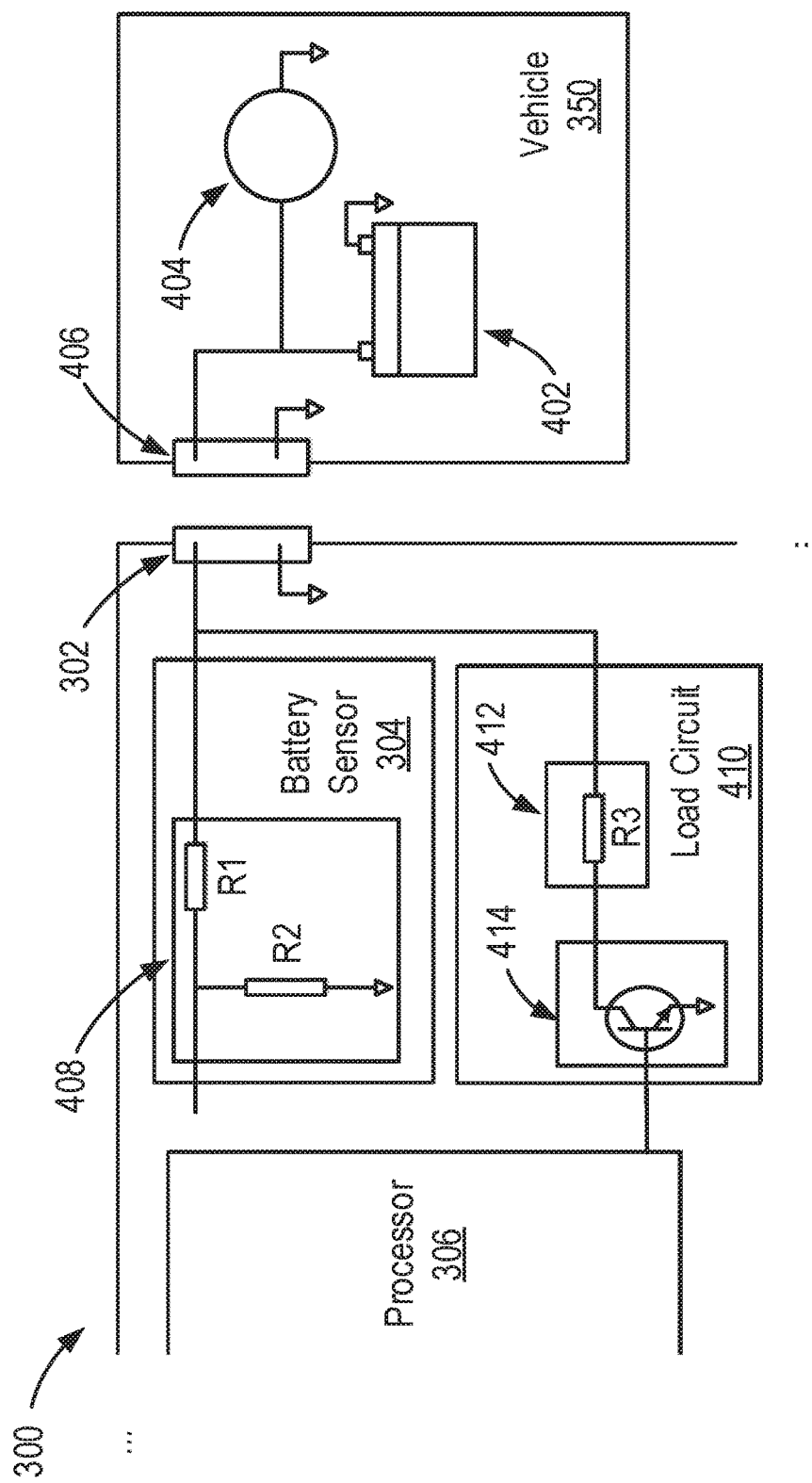
FIG. 4 is a schematic diagram illustrating one embodiment of the electronic device shown in FIG. 3.

One embodiment of the device 300 described above is illustrated in FIG. 4. Specifically, the battery sensor 304 may be electrically coupled to the vehicle battery 402 and vehicle alternator 404 via the device interface 302 and a vehicle interface 406. Such coupling may be achieved using a wired, and optionally grounded, connection, as shown in FIG. 4, as well as a wireless connection. In one implementation, the vehicle interface 406 may include an accessory outlet of the vehicle 350 (e.g., a 12V power socket) and the device interface 302 may include a plug configured to electrically and mechanically engage the accessory outlet. As shown, the battery sensor 304 may include a voltage divider 408 having a first resistor R1 and a second resistor R2. Selection of R1 and R2 may depend upon the battery voltage supplied by the vehicle battery 402, as well as on the specifics of the processor 306. For example, R1 and R2 may depend upon the voltage range capability of the processor 306.

As shown, the processor 306 is also connected to a load circuit 410 configured to apply a load to the vehicle battery 402. Specifically, the load circuit 410 may include a load 412 and a switch 414 configured to engage the load 414, as directed by the processor 306. In some implementations, the load 412 may be a resistor R3 (e.g., a heating element or resistive wire) and the switch 414 may be a transistor element. It may be readily appreciated, however, that the load 412 and switch 414 may include any elements or hardware designed to achieve the same or a similar functionality. For example, the load 412 may include any element or component that can draw power from the vehicle battery 402, and the switch 414 may include any element or component that can engage the load 412 to the vehicle battery 402. In some implementations, the load circuit 410 may include, or be part of, a function module 308, as described with reference to FIG. 3. For example, the load circuit 410 may be an electric circuit having a heating element configured to control or assist in the dispensing of a volatile material.

Referring again to FIG. 4, the processor 306 may then receive, sample, and process signals (e.g. voltage signals) from the vehicle battery 402 by way of the battery sensor 304, and determine an operational state of the vehicle 350. As described, the processor 306 may also control the load circuit 410 in determining the operational state of the vehicle 350. The processor 306 may then control the device 300, and various function modules 308 therein, as described with reference to FIG. 3.

Figure 5:
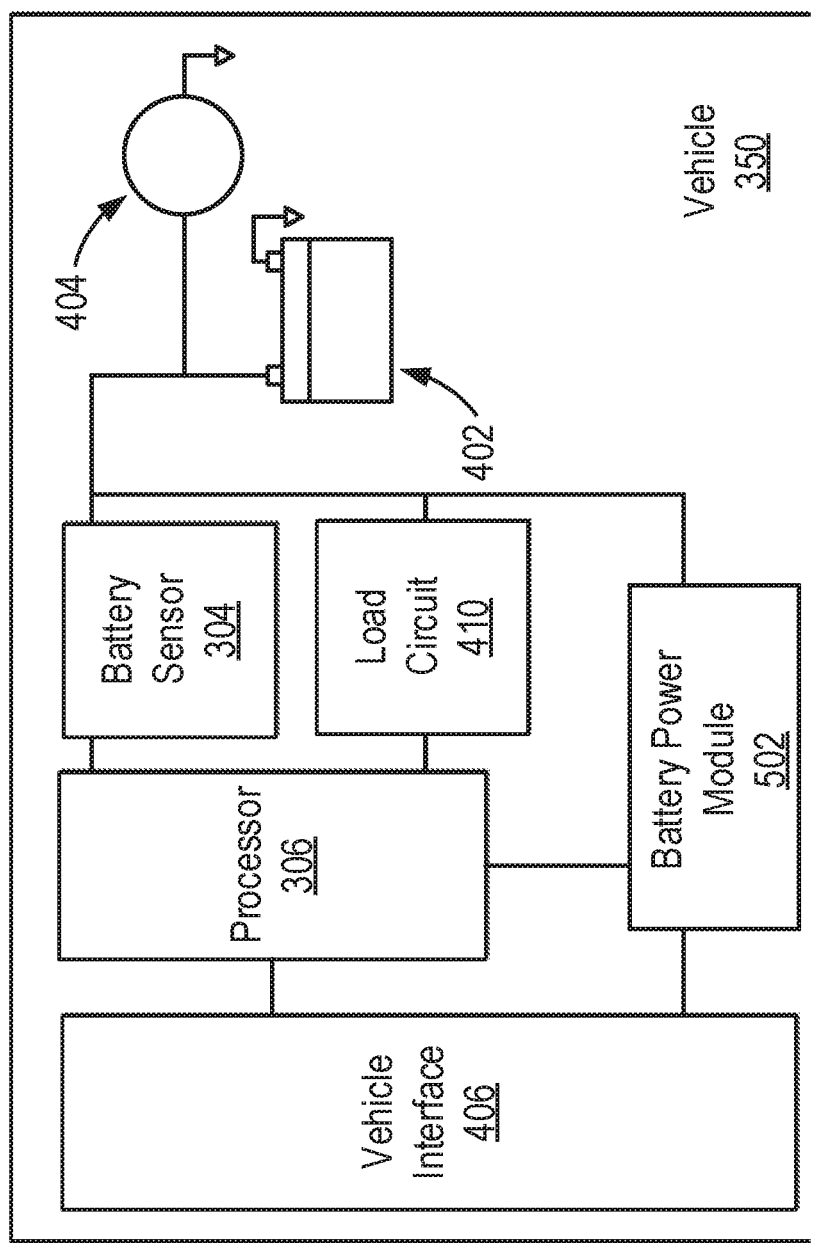
FIG. 5 is a schematic diagram of another embodiment, in accordance with aspects of the present disclosure.
Figure 5:
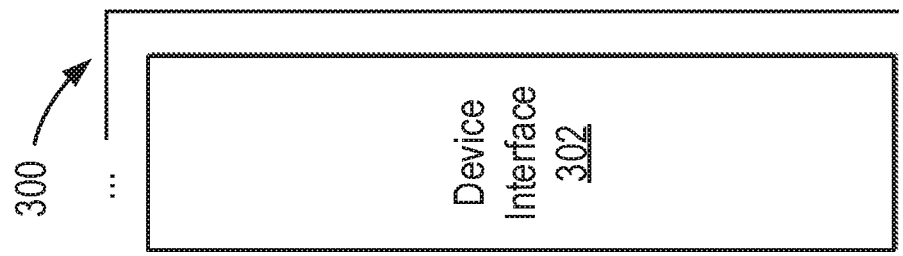

In some embodiments, as illustrated in FIG. 5, the battery sensor 304, processor 306, and load circuit 410 may be incorporated in the vehicle 350, rather than the device 300. As shown, the processor 306 may also be connected to a battery power module 502 configured to provide power to the device 300 by way of the vehicle interface 406 and device interface 302. As described, the processor 306 may be configured to determine an operational state of the vehicle 350 based on battery voltages detected using the battery sensor 304. The processor 306 may then communicate with the battery power module 502 to control power provided by the vehicle battery 402 to the device 300. For example, if it is determined that the vehicle is in an "OFF" state, or the battery is discharged below a predetermined threshold, the processor 306 may generate and send control signals to the battery power module 502 to interrupt power available to the device 300 at the vehicle interface 406. The processor 306 may also generate a report and communicate the report via the vehicle interface 406. In some aspects, the report may include an indication of battery state or vehicle operational state, as well as other information, such as operational instructions for the device 300. For example, the operational instructions may include instructions for the device 300 to enter a low-power mode.

Figure 6:
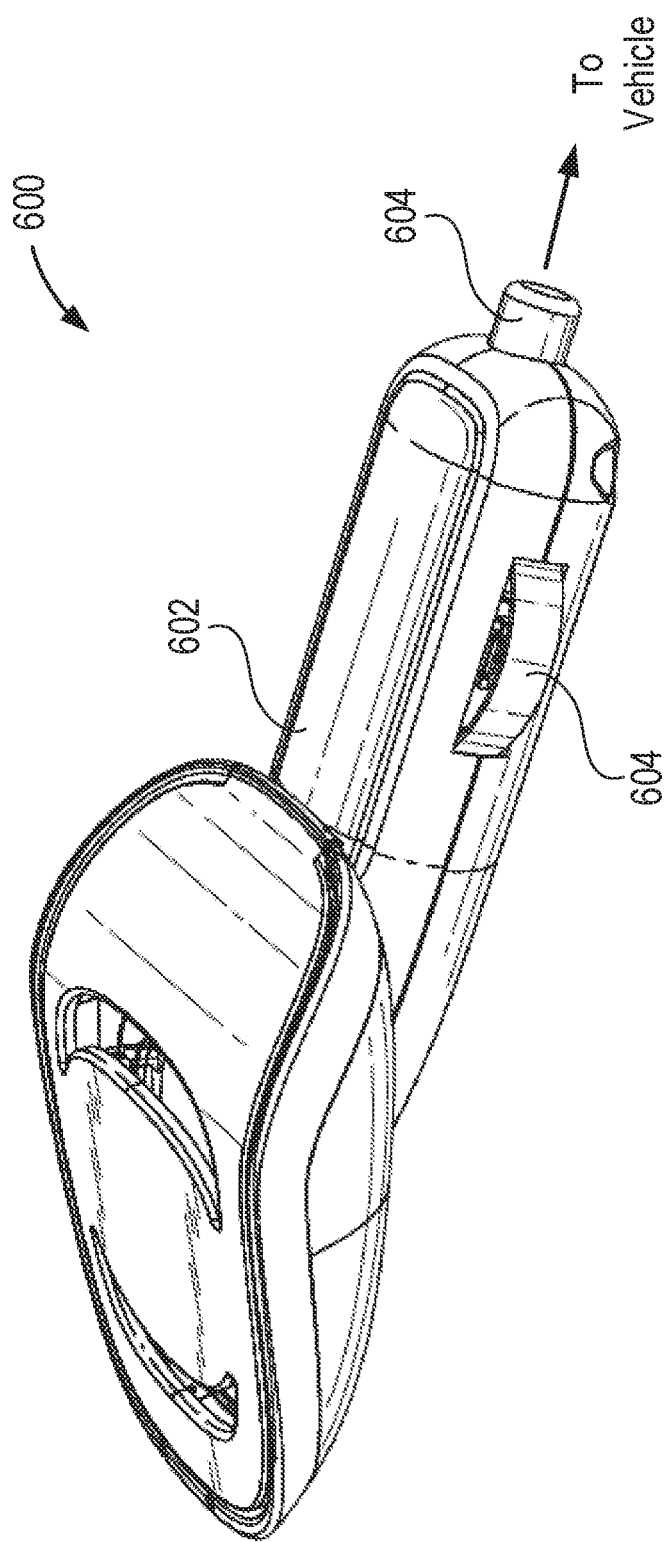
FIG. 6 is perspective view of an example volatile emitting device, in accordance with aspects of the present disclosure.

FIG. 6 shows one embodiment of a volatile material device 600 for use in a vehicle, in accordance with aspects of the present disclosure. As appreciated from the description above, FIG. 6 is provided for purposes of illustrating devices and methods, and does not limit the present disclosure in any way.

In general, the device 600 shown in FIG. 6 includes a housing 602 providing a cavity configured to hold a cartridge having a volatile material therein (not shown). The housing 602 may also be configured to hold therein an electrical assembly (not shown), as well as other elements and components. In some implementations, the electrical assembly is configured to control a release of the volatile material from the cartridge. The electrical assembly is configured to interact with a power outlet of a vehicle via socket contacts 604.

Figure 7:
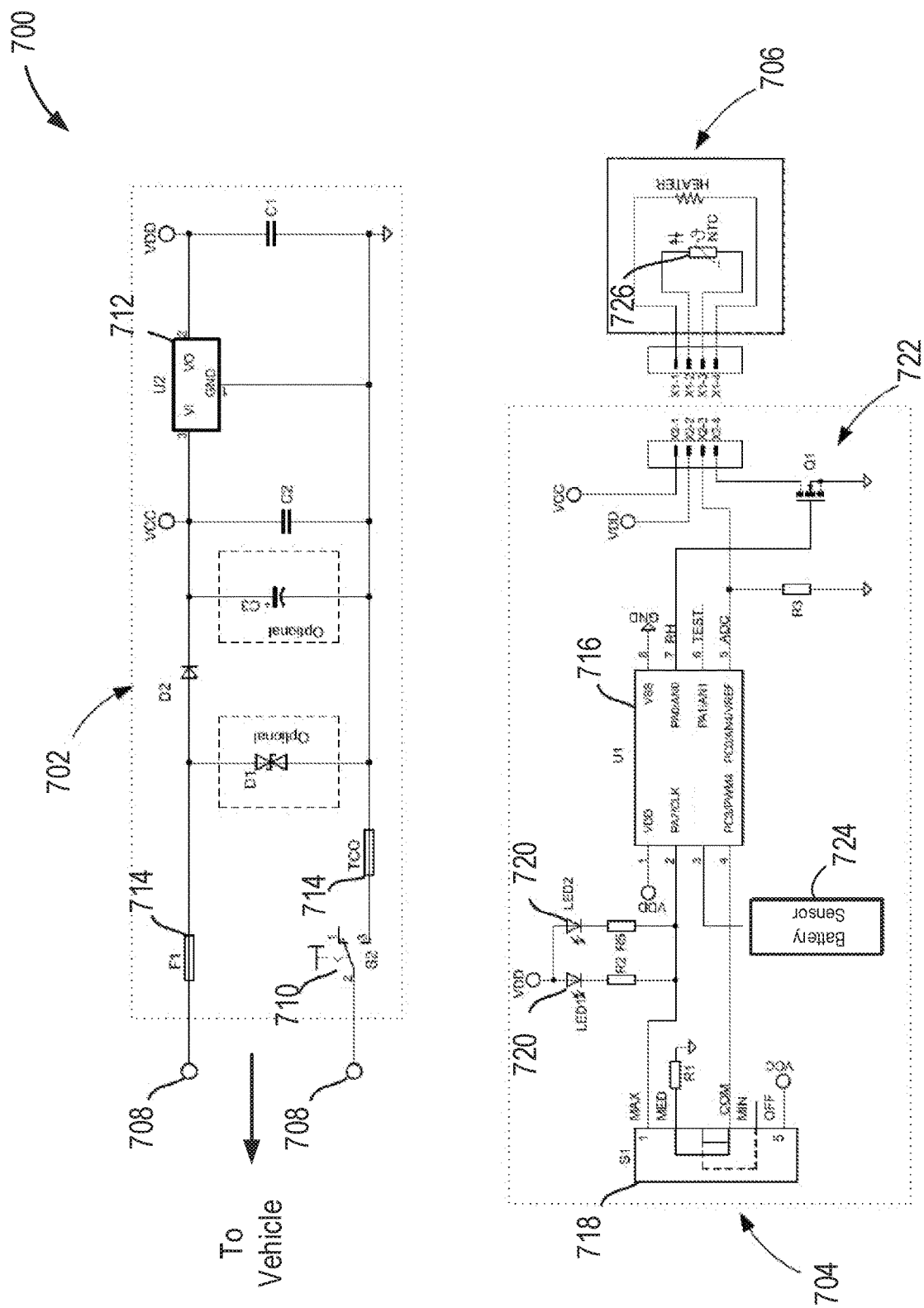
FIG. 7 is a schematic diagram of an example electrical assembly implemented in the device shown in FIG. 6.

Referring specifically to FIG. 7, an example electrical assembly 700 for use in the device 600 is shown. The electrical assembly 700 includes a power stage 702, a controller stage 704, and a heating element 706. In particular, the power stage 702 is configured to receive power from a vehicle's battery by way of input leads 708 that are connected to the socket contacts 604 shown in FIG. 6. The power stage 702 is also configured to manage the received power to operate various electrical components of the electrical assembly 700, such as the heating element 706.

As shown in FIG. 7, the power stage 702 may include a pushbutton switch 710 having an "on" and an "off" position, for example, and a voltage regulator 712. The power stage 702 may also include a number of other electrical components, including capacitors, resistors, inductors, diodes, and so forth. In addition, as shown in FIG. 7, the power stage 702 may also include a number of fuses 714, such as electrical and thermal fuses, for protecting circuit components of the electrical assembly 700 in case of electrical or thermal spikes, transients, or overload.

Still referring to FIG. 7, the control stage 704 includes a processor 716 (e.g. a microcontroller) programmed to control the operation of the heating element 706, and other electrical components. In addition, the control stage 704 also includes a slide switch 718 for selecting the mode of operation. Specifically, the power switch 718 activates inputs to the processor 716 to indicate a target temperature for the heating element 706. By way of example, the slide switch 718 may include an "off" position, and a number of "on" positions, such as a "low," "medium," and "high" position, indicating an intensity level for dispersing volatile material. The position of the slide switch 718 may be indicated by LEDs 720 included in the control stage 704 circuitry, as shown in FIG. 7. In some implementations, the same or different LEDs 720 may additionally, or alternatively, indicate an "OFF" or "ON" state of the vehicle.

When the pushbutton switch 710 and slide switch 718 are activated to an "on" position, the processor 716 can direct electric current to flow to the heating element 706, using activation element 722 and power supplied by the power stage 702. In some aspects, a PWM algorithm may be used by the processor 716 to allow the heating element 706 to heat up quickly, which in turn would allow a faster fragrance or volatile material release. In some implementations, the processor 716 may also be programmed such that if the slide switch 718 is inadvertently moved to an intermediate position that is a position between allowable settings, as described above, the electrical assembly 700, or portions thereof, may be disabled, to avoid unpredictable behavior.

As shown in FIG. 7, the control stage 704 may include a battery sensor 724 in communication with the processor 716. The battery sensor 724 is configured to detect battery voltage of the vehicle's battery, as described. The processor 716 may be configured to control a sampling of the battery voltage detected by the battery sensor 724, and determine an operational state of the vehicle using the battery voltage, as described. Based on the operational state, the processor 716 can affect the operation of the heating element 706, as well as other electrical components. In particular, the processor 716 may generate and send a control signal to the activation element 722, which would either prevent or allow power being provided to the heating element 706. For example, the processor 716 may de-energize the heating element 706 when a vehicle is in an "OFF" state. A determination of an "ON" or "OFF" state may be reported to a user, for example, using the LEDs 720.

In some modes of operation, the processor 716 may temporarily energize the heating element 706 to apply a load to the vehicle's battery. This may be desirable in the case that the battery voltage detected using the battery sensor 724 is below a predetermined threshold (e.g. about 13.0V). As described with reference to FIG. 4, applying a load (in this case the heating element 706) and monitoring battery voltage for a predetermined period of time allows for determining the operational state of the vehicle. As described, the period of time may depend on the nature of the load (e.g. power draw) and other factors.

In some embodiments, the heating element 706 may include a thermistor 726 that is coupled to the processor 716, and allows the processor 716 to shut off specific electronic components, including the heating element 706, for a predetermined amount of time if a predetermined temperature is exceeded.

Although a particular implementation is shown in FIG. 7 for the power stage 702 and controller stage 704 for managing and controlling power provided to the heating element 706, any number of modifications and variations are possible to provide functionalities as described above, as well as other functionalities. Additionally, the heating element 706 is shown to include a single resistive wire, yet it may be readily appreciated that any variation, such as two or more resistive wires, in accordance with the present disclosure may also be possible.

Figure 8:
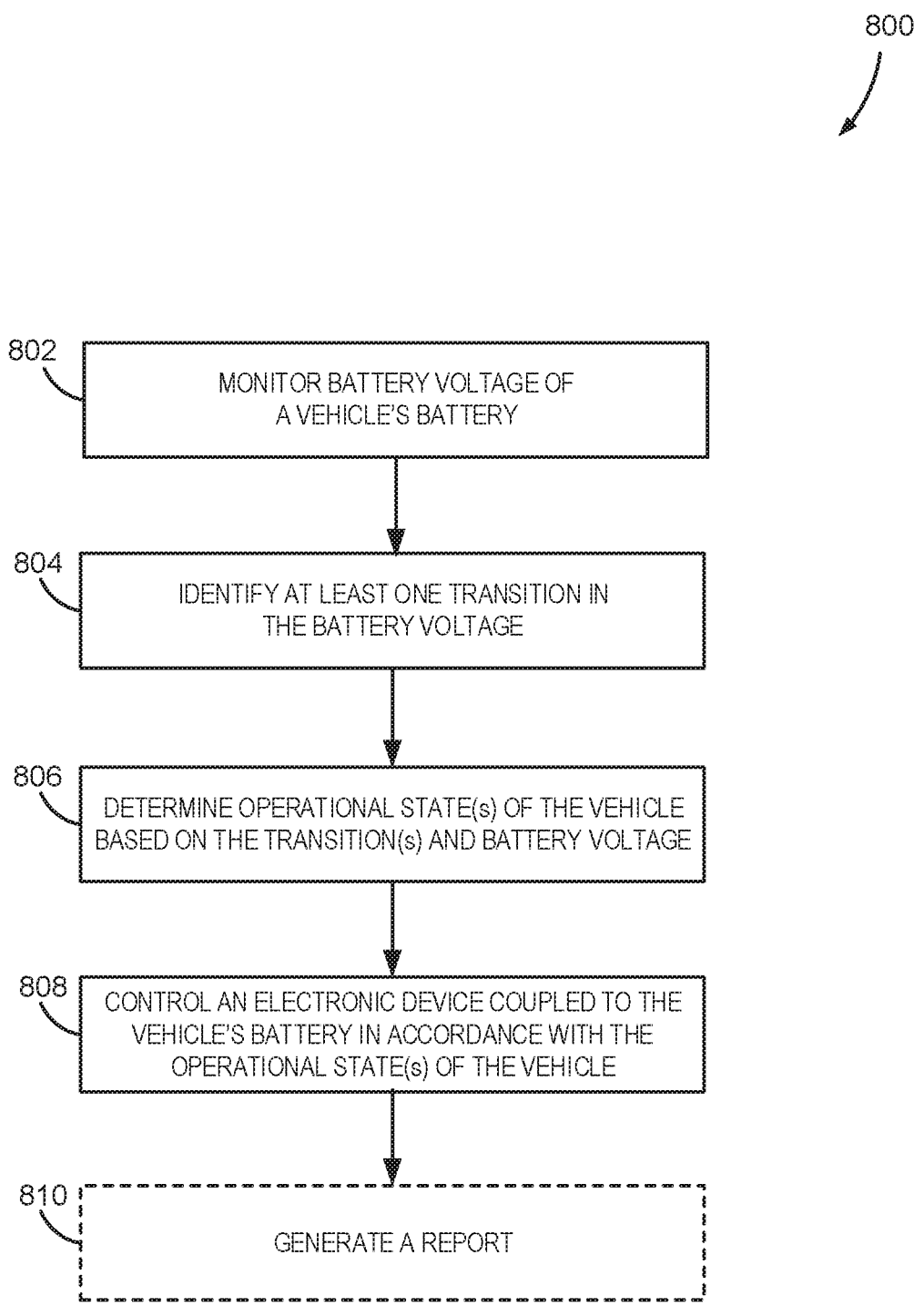
FIG. 8 is a flowchart setting forth steps of a process, in accordance with aspects of the present disclosure.

Turning to FIG. 8, another process 800, in accordance with aspects of the present disclosure, is shown. Steps of the process 800 may be carried out using any suitable device, apparatus, or system, including devices described in the present disclosure. Also, steps of the process 800 may be implemented as a program, firmware, or instructions stored in non-transitory computer readable media, executable by a processor or computer.

The process 800 may begin at process block 802 by monitoring the battery voltage of a vehicle's battery. The battery voltage may be detected using a battery sensor connected or connectable to the vehicle's battery. The battery sensor may be electrically connected, but need not be physically connected, to the vehicle's battery. As described, the battery sensor may be incorporated into, or may be part of, various electronic devices, such as portable electronic devices, volatile emitting devices, and others. In other embodiments, the battery sensor may be part of the vehicle circuitry.

The battery voltage may then be analyzed to determine the operational state of the vehicle. Specifically, the battery voltage may be analyzed to identify at least one transition therein, as indicated by process block 804. Transitions may be positive, reflecting rises in the battery voltage, or a negative, reflecting drops in the battery voltage. By way of example, a positive transition may be in a range between approximately +0.1 Volts per minute and approximately +60.0 Volts per minute, and a negative transition may be in a range between approximately −60.0 Volts per minute and approximately −0.1 Volts per minute. The operational state of the vehicle may then be determined at process block 806 based on the identified transition(s).

In some aspects, the battery voltage may also be used to determine the operational state of the vehicle, as indicated by process block 806. For instance, battery voltage detected at particular points in time (e.g. before, during, or after transitions in battery voltage), or an average battery voltage detected over a period of time, may be compared to one or more battery voltage thresholds to determine the state of the vehicle.

Figure 9:
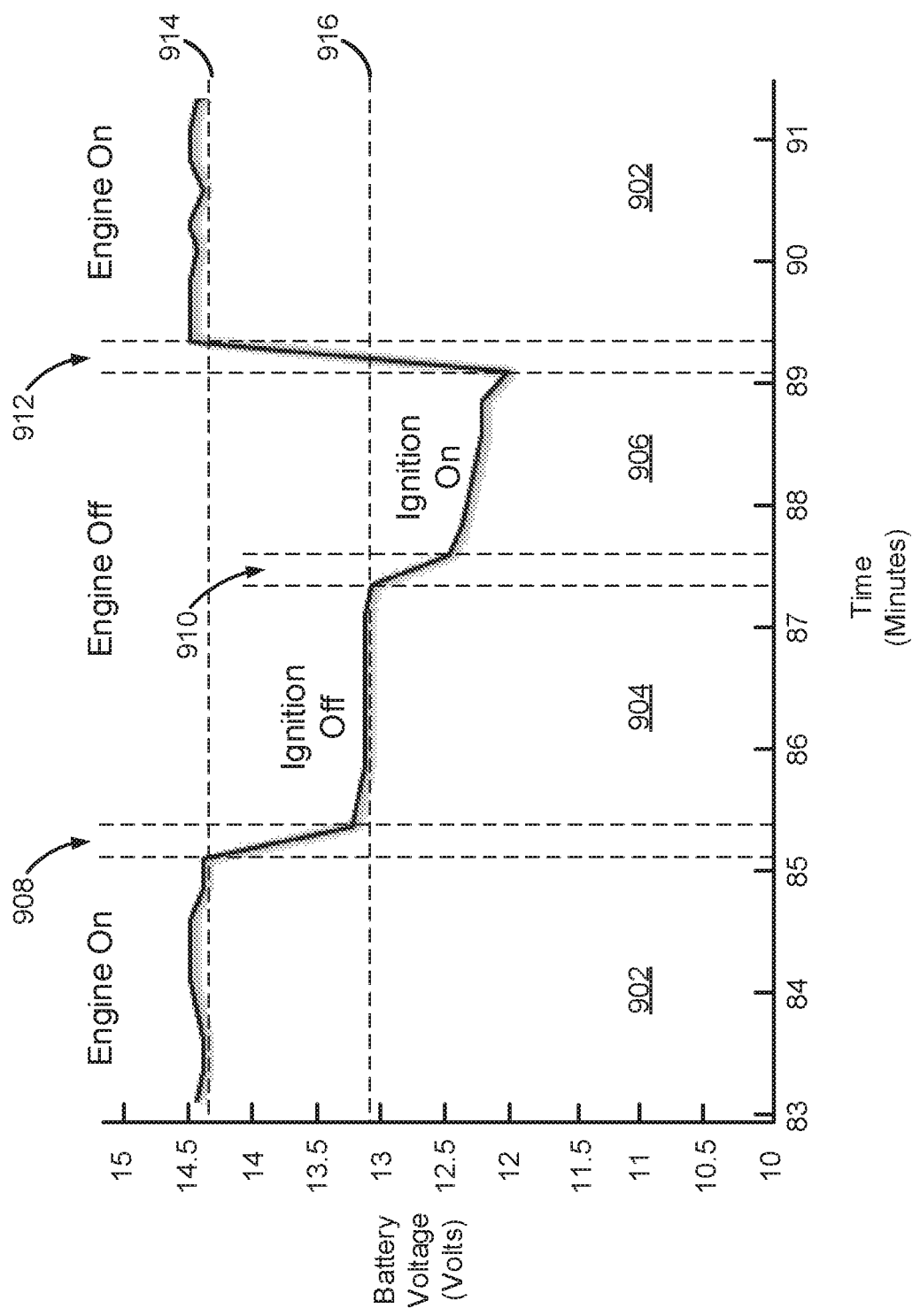
FIG. 9 is a graphical illustration showing example battery voltages in different vehicle operation scenarios.

To illustrate how an operational state of a vehicle may be determined using battery voltages and transitions in battery voltage, a non-limiting example is provided in FIG. 9. The figure shows different battery voltage signatures based on whether the vehicle is in a first operational state 902 (e.g. engine on), a second operational state 904 (e.g. engine off, ignition off) or a third operational state 906 (e.g. engine off, ignition on). As shown, transitions in the battery voltage occur when the vehicle operational state is changed. Specifically, a first transition 908 occurs between the first operational state 902 and the second operational state 904, a second transition 910 occurs between the second operational state 904 and the third operational state 906, and a third transition 912 occurs between the third operational state 906 and the first operational state 902.

As described, the operational state of the vehicle may be determined by comparing the battery voltage measured at various points in time to various battery voltage thresholds 914-916. For instance, it may be determined that the vehicle is in the first operational state 902 if the battery voltage, or average battery voltage, exceeds a first battery voltage threshold 914. However, comparing battery voltage to various thresholds might not always be sufficient to indicate the vehicle state, as described. For example, a measurement of around 13 V might not conclusively determine whether the vehicle is in the first operational state 902, the second operational state 904, or the third operational state 906. Therefore, transitions in the battery voltage may be also be used. For example, the first transition 908, indicating a drop in the battery voltage (i.e. negative transition), may be used to determine if the engine has been turned off. Similarly, the third transition 912, indicating a rise in the battery voltage (i.e. positive transition), may be used to determine if the engine has been turned on.

As seen in FIG. 9, both the first transition 908 and the second transition 910 indicate drops in the battery voltage. Therefore, discerning whether the ignition is off or on may also include analyzing battery voltage. For instance, a battery voltage above a second battery voltage threshold 916 combined with a negative voltage drop could directly indicate the operational state where the engine is off and the ignition is off.

It may be readily appreciated that the battery voltage pattern in FIG. 9 is for illustrative purposes, and therefore non-limiting. Indeed, the number and type of operational states, battery voltages and transitions may vary depending upon the particulars of the vehicle and vehicle operation, battery age and charging, as well as other factors.

Referring again to FIG. 8, an electronic device coupled to the vehicle's battery may then be controlled at process block 808 in accordance with the determined operational state of the vehicle. As described, this step may include controlling various device functions or operational aspects of the electronic device, such as interrupting or modifying device charging or changing a mode of operation.

As shown, a report may be optionally provided at process block 810. The report may be in any form and include any information. The report may be provided to an output, and/or stored in a memory. For example, the report may be provided using a display and/or LEDs, and so forth, and indicate various battery voltages detected, operational state(s) of the vehicle, condition of devices, a communication link, and other data or information.

INDUSTRIAL APPLICABILITY

Devices and methods are presented that provide a novel approach for controlling electronic devices for use in a vehicle based on the operational state of the vehicle.

Numerous modifications to the present invention will be apparent to those skilled in the art in view of the foregoing description. Accordingly, this description is to be construed as illustrative only and is presented for the purpose of enabling those skilled in the art to make and use the invention and to teach the best mode of carrying out same. The exclusive rights to all modifications which come within the scope of the appended claims are reserved.

The invention claimed is:

1. A method for controlling an electronic device for use in a vehicle, the method comprising:
    monitoring a battery voltage of a vehicle's battery using a battery sensor connected thereto;
    identifying at least one transition in the battery voltage using a processor in communication with the battery sensor;
    determining, using the processor, an operational state of the vehicle based on the transition and the battery voltage by:

controlling a load circuit using the processor to apply a load to the vehicle's battery; and determining the operational state of the vehicle based on a change in the battery voltage due to the load; and controlling, using the processor, an electronic device coupled to the vehicle's battery in accordance with the operational state of the vehicle.

2. The method of claim 1, wherein the method further comprises sensing the battery voltage intermittently or continuously using the battery sensor.

3. The method of claim 1, wherein the method further comprises comparing the battery voltage to at least one battery voltage threshold to determine the operational state of the vehicle.

4. The method of claim 3, wherein the method further comprises analyzing the transition in the battery voltage to determine the operational state of the vehicle.

5. The method of claim 4, wherein the method further comprises identifying a positive transition in the battery voltage.

6. The method of claim 5, wherein the positive transition is in a range between approximately +0.1 Volts per minute and approximately +60.0 Volts per minute.

7. The method of claim 4, wherein the method further comprises identifying a negative transition in the battery voltage.

8. The method of claim 5, wherein the negative transition is in a range between approximately −60.0 Volts per minute and approximately −0.1 Volts per minute.

9. The method of claim 1, wherein the method further comprises controlling at least one device function of the electronic device.

10. An electronic device for use in a vehicle, the device comprising:
a battery sensor configured to detect a battery voltage when connected to a vehicle's battery; and
a processor in communication with the battery sensor that is configured to:
monitor the battery voltage of a vehicle's battery using the battery sensor;
identify at least one transition in the battery voltage;
determine an operational state of the vehicle based on the transition and the battery voltage by:
controlling a load circuit connected to the vehicle's battery to apply a load to the vehicle's battery; and
determining the operational state of the vehicle based on a change in the battery voltage due to the load; and
control the electronic device in accordance with the operational state of the vehicle.

11. The device of claim 10, wherein battery sensor is further configured to sense the battery voltage intermittently or continuously.

12. The device of claim 10, wherein the processor is further configured to compare the battery voltage to at least one battery voltage threshold to determine the operational state of the vehicle.

13. The device of claim 12, wherein the processor is further configured to analyze the transition in the battery voltage to determine the operational state of the vehicle.

14. The device of claim 13, wherein the processor is further configured to identify a positive transition in the battery voltage.

15. The device of claim 14, wherein the positive transition is in a range between approximately +0.1 Volts per minute and approximately 60.0 Volts per minute.

16. The device of claim 13, wherein the processor is further configured to identify a negative transition in the battery voltage.

17. The device of claim 16, wherein the negative transition is in a range between approximately −60.0 Volts per minute and approximately −0.1 Volts per minute.

18. The device of claim 10, wherein the processor is further configured to control at least one device function of the electronic device.

* * * * *